United States Patent [19]
Bakker et al.

[11] Patent Number: 5,735,698
[45] Date of Patent: Apr. 7, 1998

[54] CONNECTOR FOR MOUNTING AN ELECTRICAL COMPONENT

[75] Inventors: Jan Bakker, Doorn; Jan Bart Goossens, De Bilt, both of Netherlands

[73] Assignee: Lucent Technologies Inc., Murray Hill, N.J.

[21] Appl. No.: 498,738

[22] Filed: Jul. 6, 1995

[30] Foreign Application Priority Data

May 19, 1995 [GB] United Kingdom ............... 9510136

[51] Int. Cl.$^6$ ........................................ H01R 4/58
[52] U.S. Cl. ........................... 439/91; 439/66; 439/73
[58] Field of Search .................... 439/72, 73, 83, 439/66, 91, 526, 331, 329

[56] References Cited

U.S. PATENT DOCUMENTS

| | | | |
|---|---|---|---|
| 3,719,917 | 3/1973 | Fischer et al. | 439/329 |
| 4,918,513 | 4/1990 | Kurose et al. | 439/73 |
| 5,321,583 | 6/1994 | McMahon | 439/91 X |
| 5,364,278 | 11/1994 | Laub | 439/73 X |
| 5,379,188 | 1/1995 | Winslow | 439/72 X |
| 5,473,510 | 12/1995 | Dozier, II | 439/66 X |

*Primary Examiner*—Khiem Nguyen

[57] ABSTRACT

A connector for a circuit component comprises a rigid support frame having a central aperture into which the component may be placed, and spring means around the support and having a plurality of spring projections which project beyond the support frame for co-operation with perforations in a planar substrate, such as a PCB. The projections may have hook-shaped lower ends which locate against the underside of the PCB. A layer of anisotropically electrically conductive material is located between the component and the substrate. The connector and component together with the conductive layer in position form a substrate-mountable device.

5 Claims, 2 Drawing Sheets

CONNECTOR FOR MOUNTING AN ELECTRICAL COMPONENT

RELATED APPLICATIONS

Pursuant to 37 C.F.R. 1.78(a)(2), applicants claim the right of priority of co-pending British Patent Application 9510136.6, which was filed on May 19, 1995.

FIELD OF THE INVENTION

This invention relates to connectors, especially to connectors for connecting an electrical component such as an integrated circuit or hybrid or the like to a printed circuit board or similar planar substrate to provide both electrical and mechanical connections.

BACKGROUND OF THE INVENTION

Previously, such connections have been provided on a printed circuit board by means of soldering the pins or legs on the component to conducting tracks or points on the board, or by placing the component in a component socket which has been mounted on the board as part of a normal component mounting operation for the board. Thus, these operations have the disadvantage of the need for applying heat, which can damage the components and needs careful control, and also the provision of soldering apparatus, whether for conventional or wave soldering, or they have the disadvantage of the need for having a component socket previously mounted on the board.

SUMMARY OF THE INVENTION

Therefore, it would be advantageous to provide a connector by which a component can be attached electrically and mechanically to a planar substrate such as a printed circuit board without the need for application of heat, or the use of a tool, and without the need for having a component socket previously mounted on the substrate. It would also be advantageous to provide a connector such that the connector and component can be provided as an assembly for direct mounting on a planar substrate, again without the need for heat or a tool.

According to one embodiment of the present invention, a connector for a circuit component comprises a rigid support having a central aperture into which the component can be placed; and spring means around the support having a plurality of spring projections projecting beyond the aperture for co-operation with perforations in a planar substrate.

Preferably the spring projections have hook-shaped lower ends for location against the underside of the substrate. Preferably the spring means provides pressure to hold the hook-shaped lower ends against the underside of the substrate. The upper part may be dished in shape and arranged in contact with the component to provide this pressure. Optionally the connector is further provided with a plurality of rigid projections which cooperate with further perforations in the substrate.

Optionally the connector further comprises a layer of resilient anisotropically electrically conductive material adjacent the aperture. This material may be any of the commercially available products of this nature, such as the Elastomeric Conductive Polymer Interconnect (ECPI) material produced by AT&T or "Ampliflex" material produced by AMP Inc., or any similar material, which may be referred to as "zebra" material.

Preferably the spring projections pass through the conductive layer.

Also according to another embodiment of the invention, a substrate-mountable device comprises an electrical circuit component located in a central aperture in a rigid support; a layer of resilient anisotropically electrically conductive material adjacent the component; and around the support a spring means having a plurality of spring projections which project beyond the support and the component for co-operation with perforations in a planar substrate.

According to yet another embodiment of the invention, there is provided an electrical circuit comprising a printed circuit board having mounted thereon an electrical circuit component located in a central aperture in a rigid support, the support being held on the board by a spring means having projections which cooperate with perforations in the board, and there being a layer of anisotropically electrically conductive material between the component and the board.

Preferably the perforations in the board are spaced so that passage of the projections through the perforations initially causes lateral movement of the projections, and subsequently the projections spring back so that the hook-shaped lower ends of the projections locate against the underside of the board.

BRIEF DESCRIPTION OF THE FIGURES

One embodiment of the invention will now be described by way of example only with reference to the accompanying drawings in which.

DETAILED DESCRIPTION

Figure 1:
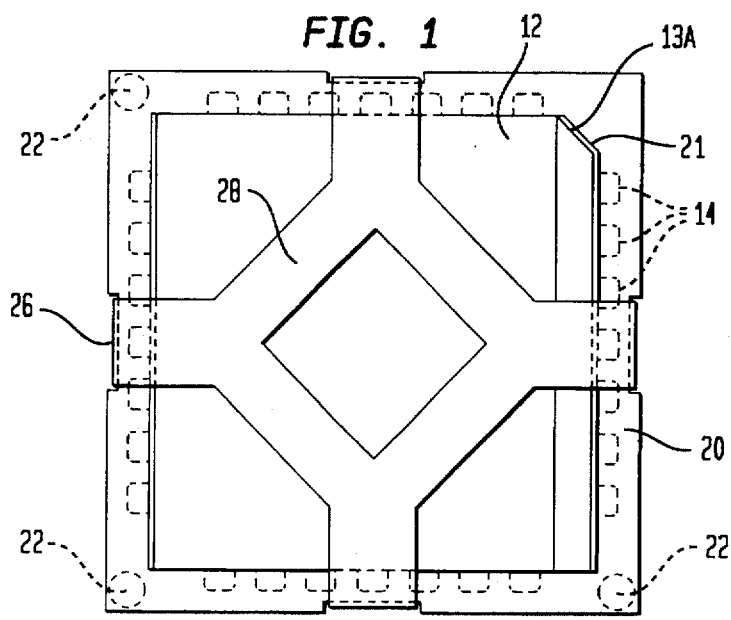
FIG. 1 is a view from above of a connector containing a circuit component.
Figure 2:
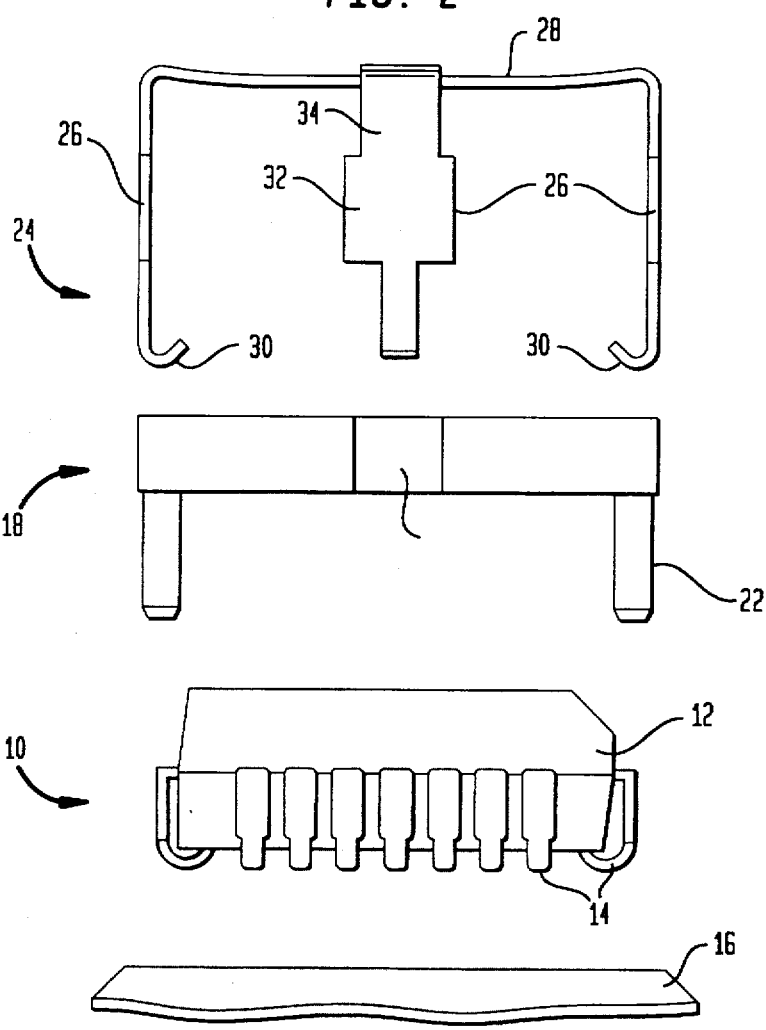
FIG. 2 is an exploded side view of the connector and component.

In FIGS. 1 and 2, a circuit component 10 comprises a component body 12 and a number of electrical connection pins 14 along the four sides of the body and projecting beyond it. The component 12 has a chamfered edge 13 on its top side, and a chamfered corner 13A, as is conventional on electronic components. Below the connections is a sheet 16 of resilient anisotropically conductive material, or "zebra" material, which comprises a number of fine-pitch conductive elements mounted in a resilient non-conductive web material.

A connector support 18 comprises a rigid rectangular frame 20 having a central aperture of the same shape and slightly greater area than the component body 12, so as to fit closely around the body but not the pins 14. The frame 20 has a chamfered corner 21 corresponding with the chamfered corner 13A of the component 12. The support 18 also has projecting pegs 22 spaced at three of the four corners of the frame 20, the pegs 22 being of such length as to project beyond the pins 14 on any component in the aperture. The provision of three pegs 22 ensures correct placement on a PCB, as will be explained below.

A spring clip 24 comprises four spring legs 26 projecting at right angles from an upper part 28; each spring leg 26 has a hook-shaped foot 30 at its lower end, and an intermediate broad section 32 with narrower sections 34 above. The leg spacings correspond to the external dimensions of the support 18, and the frame 20 has on its side walls recesses 36 of width equal to or slightly greater than the width of the narrow sections 34 of the legs.

The upper part 28 of the spring clip 24 is in the form of an open diamond connecting all four legs 26; the upper part 28 is downwardly dished in shape. The spring clip is made of any suitable spring metal or spring plastics material.

Figure 3:
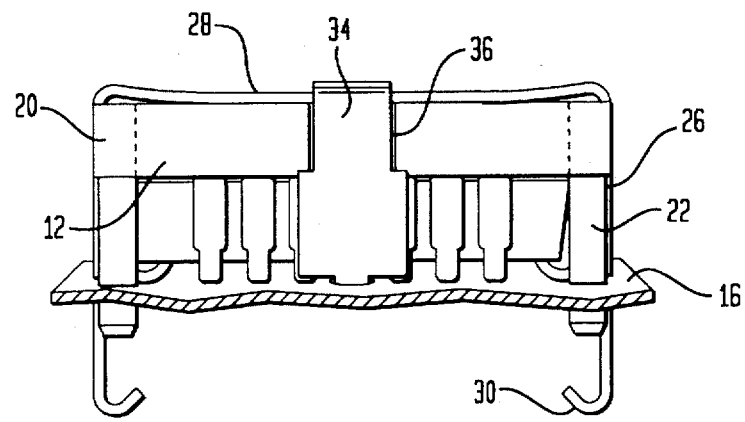
FIG. 3 is a side view of a connector and component when assembled.
Figure 4:
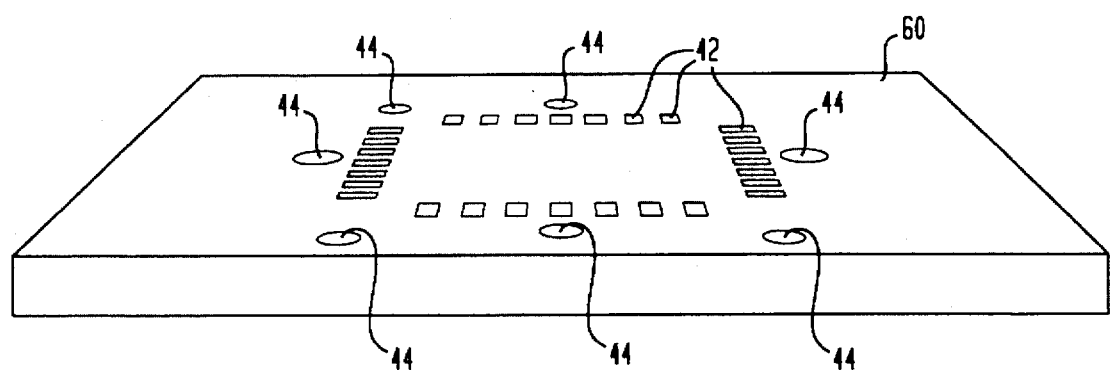
FIG. 4. is a printed circuit board (PCB) on which the component is to be mounted.

FIG. 3 shows the connector assembled around the component 10. The component body 12 just fits between the pegs 22 and into the aperture in the frame 20. The spring legs 26 fit closely over the frame 20 with the narrow leg sections 34 located in the recesses 36. The broader sections 32 below the narrow sections extend laterally beyond the recesses 36 and prevent upward movement of the legs.

The hook-shaped feet 30 of the spring legs 26 project beyond the ends of pegs 22, and both the feet 30 and the pegs 22 project through the layer 16 and hold it in position.

A PCB 40 is shown below the component and connector; in addition to the usual electrical connective areas 42 the board has four perforations 44 corresponding in position to the spring legs 26, and three perforations 46 corresponding to the pegs 22.

To assemble the component 10 into the connector and onto the PCB 40, the component is placed in the frame 20 of the support 18 and the conductive layer 16 is pushed over the pegs 22. The chamfered corners 13A, 21 on the component 10 and frame 20 ensure correct placement of the component 10 in the frame 20. The spring clip 24 is pushed down over the support 18, when the spring legs splay out slightly until the narrow parts 34 snap into the recesses 36. The legs 26 also pass through the layer 16. The connector is then placed on the PCB with the legs 26 corresponding to perforations 44. As the legs are pushed into the perforations, they splay out to allow the feet 30 to pass through the board thickness and then spring back to allow the feet 30 to locate against the board underside. The spacing of perforations 44 is selected to achieve this.

The dished upper part of the spring 24 now presses against the top of component 10 and holds the pins 14 on component 10 against the conducting layer 16 and holds the layer 16 against the connections 42 on the board, giving good electrical connection because the layer 16 is resilient. The close spacing of the conductors in the layer 16 is such that each pin 14 is connected to its corresponding connection 42 by a plurality of conducting paths, the resilience of the layer 16 taking up any irregularities of the board surface. The open structure of the frame 20 enables any printed data on the top surface of the component 10 to be easily read.

During connection, the pegs 22 also enter the perforations 46, but do not penetrate through the board because they are shorter than legs 26. The pegs prevent lateral movement on the board.

Connector supports 18 and spring clips 24 may be provided in a number of standard shapes and sizes corresponding to standard component shapes and sizes. PCBs having location perforations 44, 46 can also be provided as a standard item in a variety of perforation spacings.

A component supplier using the invention can supply components ready for mounting on a PCB or other substrate without the use of either heat or a tool of any type, and both mechanical and electrical connections can be made. Thus the supplier may supply the assembly shown in the upper part of FIG. 3 as a unit ready for mounting on the PCB 40 by an equipment manufacturer. Also, where an optional component is to be installed on a PCB after the board has been assembled, for example in the field, there is no need for a component socket to be previously mounted on the board.

What is claimed is:

1. A connector for securing a circuit component to a printed circuit board, said circuit component comprising a component body and a plurality of electrical connection pins, said connector comprising:
   (a) a sheet of resilient anisotropically conductive material;
   (b) a connector support comprising:
      (1) a rigid rectangular frame having:
         (i) four sides, each of which has a vertical recess,
         (ii) four corners,
         (iii) a central aperture into which said component body can be placed so as to fit closely around said component body; and
      (2) a projecting peg at three of said four corners, wherein each projecting peg projects through said sheet of resilient anisotropically conductive material; and
   (c) a spring clip comprising:
      (1) an upper part; and
      (2) four spring projections projecting at right angles from said upper part, wherein each spring projection has:
         (i) a hook-shaped foot that projects through said sheet of resilient anisotropically conductive material,
         (ii) an intermediate broad section, and
         (iii) a narrower section that fits within one of said vertical recesses.

2. A connector according to claim 1, wherein said spring clip provides pressure to hold said hook-shaped feet against said printed circuit board.

3. A connector according to claim 2, wherein said upper part is in the form of an open diamond and downwardly dished in shape.

4. A substrate-mountable device comprising:
   an electrical circuit component located in a central aperture in a rigid support;
   a sheet of resilient anisotropically electrically conductive material adjacent the component; and
   around the support a spring clip having a plurality of spring projections which project beyond the support and the component, through said sheet of resilient anisotropically electrically conductive material, for co-operation with a planar substrate.

5. A connector according to claim 1 wherein said rigid rectangular frame has a chamfered corner.

* * * * *